(12) United States Patent
Rebstock

(10) Patent No.: US 10,665,486 B2
(45) Date of Patent: *May 26, 2020

(54) SUBSTRATE CARRIER HAVING DRIP EDGE CONFIGURATIONS

(71) Applicant: BROOKS CCS GmbH, Radolfzell (DE)

(72) Inventor: Lutz Rebstock, Gaienhofen (DE)

(73) Assignee: BROOKS CCS, GmbH, Gaienhofen (DE)

( * ) Notice: Subject to any disclaimer, the term of this patent is extended or adjusted under 35 U.S.C. 154(b) by 630 days.

This patent is subject to a terminal disclaimer.

(21) Appl. No.: 14/740,214

(22) Filed: Jun. 15, 2015

(65) Prior Publication Data

US 2015/0279710 A1    Oct. 1, 2015

Related U.S. Application Data

(63) Continuation of application No. 13/863,354, filed on Apr. 15, 2013, now Pat. No. 9,064,687.

(60) Provisional application No. 61/625,083, filed on Apr. 17, 2012.

(51) Int. Cl.
| | | |
|---|---|---|
| *B25B 11/00* | (2006.01) | |
| *H01L 21/673* | (2006.01) | |
| *A47J 47/20* | (2019.01) | |
| *H01L 21/67* | (2006.01) | |
| *H01L 21/02* | (2006.01) | |
| *H01L 21/306* | (2006.01) | |

(52) U.S. Cl.
CPC ........ *H01L 21/67313* (2013.01); *A47J 47/20* (2013.01); *H01L 21/02041* (2013.01); *H01L 21/30604* (2013.01); *H01L 21/67057* (2013.01); *H01L 21/67086* (2013.01)

(58) Field of Classification Search
CPC .......... B25B 11/00; B25B 11/02; B23P 19/10; B23Q 3/00; H01L 21/67; H01L 21/673; H01L 21/02041; H01L 21/67313
See application file for complete search history.

(56) References Cited

U.S. PATENT DOCUMENTS

| | | | |
|---|---|---|---|
| 4,872,554 A * | 10/1989 | Quernemoen | .......... C30B 31/10 |
| | | | 206/454 |
| 5,704,493 A | 1/1998 | Fujikawa et al. | |
| 5,882,168 A | 3/1999 | Thompson et al. | |
| 6,089,377 A | 7/2000 | Shimizu | |
| 6,202,282 B1 * | 3/2001 | Holdsworth | ............ E04C 5/165 |
| | | | 29/456 |
| 6,340,090 B1 | 1/2002 | Jahani et al. | |
| 6,443,316 B1 | 9/2002 | Mao | |
| 2003/0056391 A1 | 3/2003 | Shikami | |

(Continued)

FOREIGN PATENT DOCUMENTS

WO    03041880    5/2003

*Primary Examiner* — Lee D Wilson
(74) *Attorney, Agent, or Firm* — Perman & Green, LLP; Colin C. Durham

(57) ABSTRACT

Substrate carrier can have drainage area leading the liquid away from the substrates, so that liquid droplet can be channeled away from the substrate area. The drainage area can include tilted lines and surfaces toward the ground away from the substrates. The carrier can further have drainage area leading the liquid to an end of the carrier, which then can be channeled to the ground without being free fall to the ground.

17 Claims, 9 Drawing Sheets

(56) References Cited

U.S. PATENT DOCUMENTS

| | | | | |
|---|---|---|---|---|
| 2010/0102551 A1* | 4/2010 | Zeiber | ............... | F16L 33/23 |
| | | | | 285/253 |
| 2010/0241271 A1 | 9/2010 | Shimizu et al. | | |
| 2014/0172026 A1* | 6/2014 | Biedermann | ........ | A61B 17/844 |
| | | | | 606/326 |
| 2015/0279710 A1* | 10/2015 | Rebstock | .......... | H01L 21/67057 |
| | | | | 438/747 |

* cited by examiner

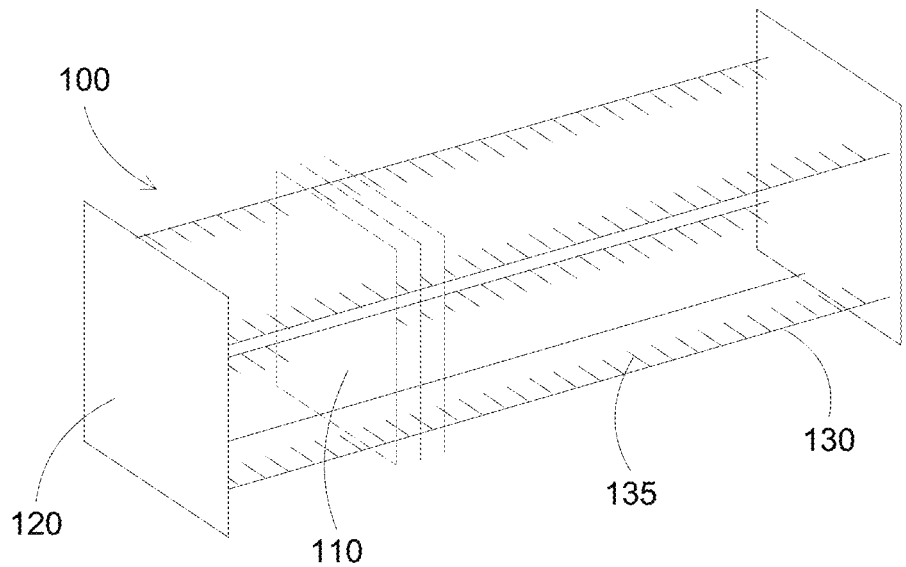
Fig. 1A
(Prior Art)
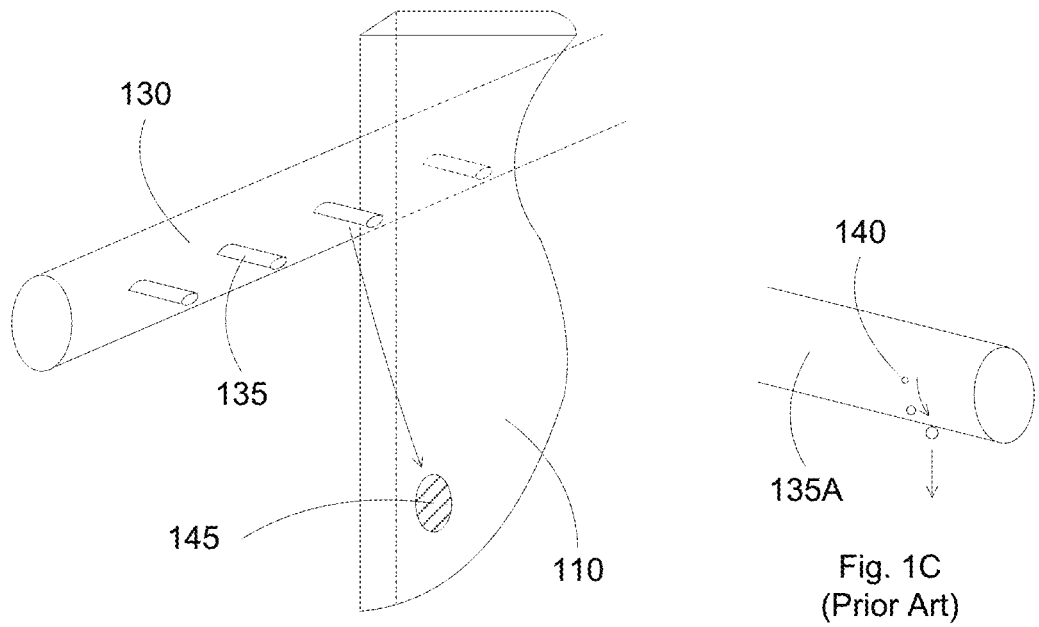
Fig. 1B
(Prior Art)
Fig. 1C
(Prior Art)

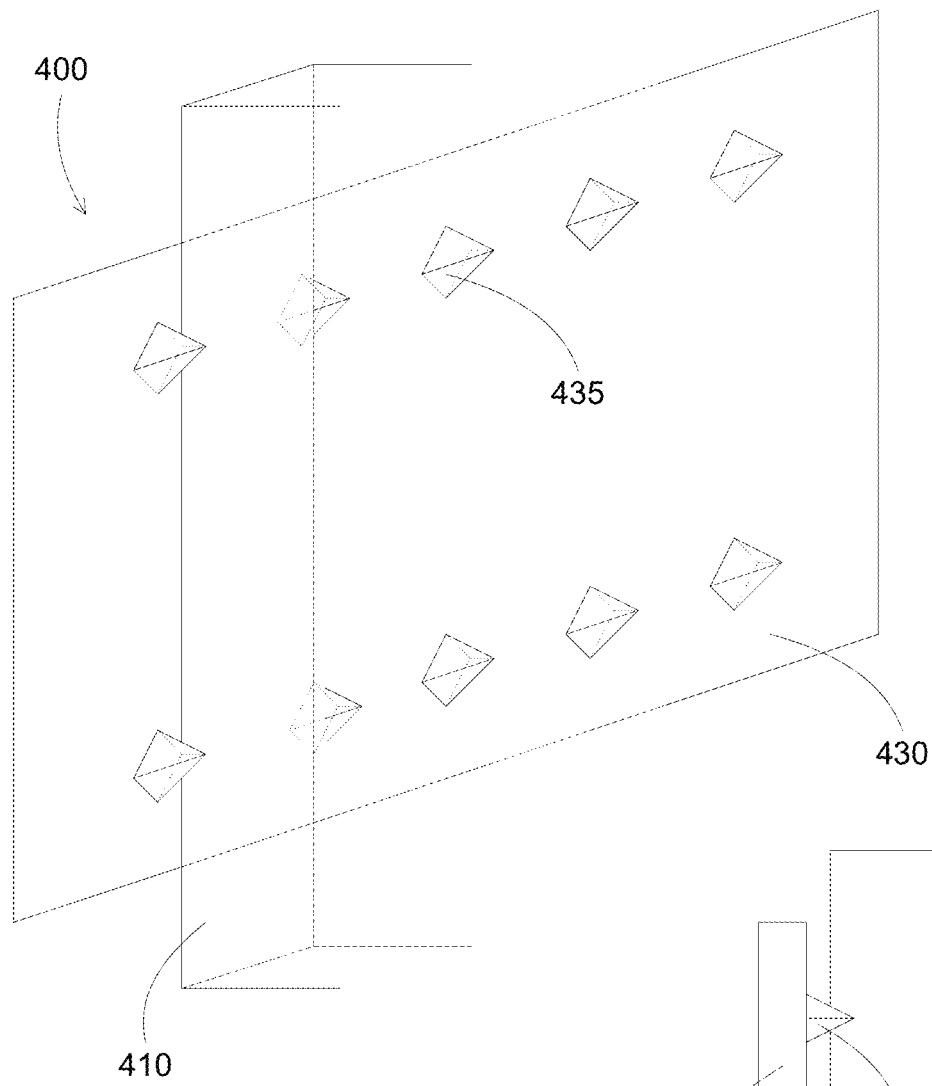
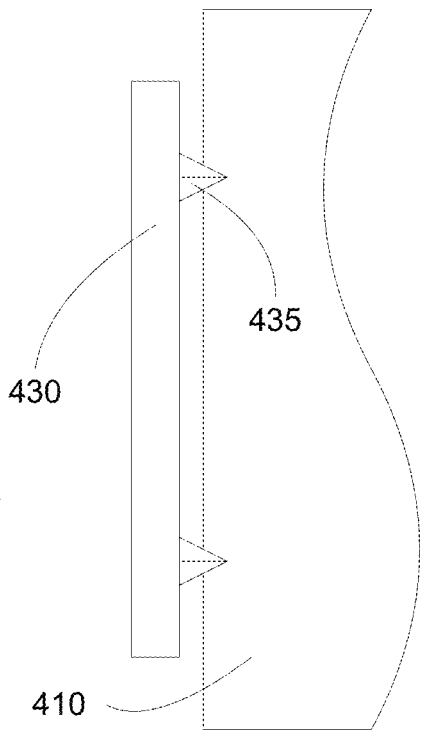
Fig. 4A
Fig. 4B

SUBSTRATE CARRIER HAVING DRIP EDGE CONFIGURATIONS

This application is a continuation of and claims priority from U.S. patent application Ser. No. 13/863,354, filed on Apr. 15, 2013, entitled "Substrate carrier having drip edge configurations", which is incorporated herein by reference.

BACKGROUND

In semiconductor processing, a large number of semiconductor substrates are processed in a semiconductor facility. For example, integrated circuit devices are fabricated on circular single crystal silicon substrates. Solar cells are typically fabricated in square or rectangular substrates, either single crystal silicon or polycrystalline silicon. The substrates are stored in carriers, which are designed to hold each substrate separately without touching each other.

During single substrate processing, individual substrates are brought from the carriers to a processing chamber, where each substrate is processed separately. During batch processing, such as a wet etch process, multiple substrates are transferred to a process carrier, which supports the substrates with adequate separate between the substrates to enable uniform processing of all substrates within the carrier. The carrier is then submerged in a tank filled with chemical liquid, which can etch all substrates at a same time.

FIGS. 1A-1C illustrate an exemplary prior art process carrier for a wet processing. In FIG. 1A, a carrier 100 is shown, supporting substrates 110. The carrier 100 comprises two end plates 120, together with a number of rods 130. The rods are spaced as to allow the substrates to be positioned between the rods. The carrier 110 can comprise side rods for support the sides of the substrates, and bottom rods for support the substrate bottom. Option top rods can be included, for example, to prevent dropping of the substrates during movements. The rods 130 can comprise teeth 135, which can separate the substrates.

FIG. 1B shows a detailed of a portion of a rod 130 with teeth 135. The teeth comprise a cylindrical shape, disposed in a horizontal direction. The separation of the teeth is large enough to accommodate the substrate 110. During liquid processing, droplets 140 can be adhered to the carrier surfaces, such as on the surfaces of the tooth 135A (FIG. 1C). When wet processing is completed, the carrier is removed from the liquid tank. The droplets 140 can migrate along the surface of the teeth, and potentially dropping on the substrate 110, forming contaminated spot 145.

SUMMARY

In some embodiments, systems and methods are provided for reducing liquid contamination in substrates supported by a carrier. For example, after a wet process, the carrier can have liquid accumulated on their surfaces. The carrier can be configured to reduce or eliminate the dripping of the liquid onto the substrates, which can potential contaminate the substrate surfaces.

In some embodiments, the carrier can have drainage area leading the liquid away from the substrates, so that any droplet formation and released would fall outside of the substrate area and not on the substrates. The drainage area can include tilted lines and surfaces toward the ground away from the substrates. The drainage area can avoid trappable configurations near or in the substrate area, such as a point shape in a space defined between two substrates, a horizontal line or surface in the space defined between two substrates, or a downward facing line or surface in the space defined between two substrates.

In some embodiments, the carrier can have drainage area leading the liquid to an end of the carrier, which then can be channeled to the ground without being free fall to the ground. The channeling of liquid droplets can avoid the splatter of the liquid, thus can reduce or eliminate potential substrate contamination.

BRIEF DESCRIPTION OF THE DRAWINGS

FIGS. 1A-1C illustrate an exemplary prior art process carrier for a wet processing.

FIGS. 4A-4B illustrate an exemplary carrier having a slanted teeth configuration according to some embodiments.

DETAILED DESCRIPTION OF THE EMBODIMENTS

In some embodiments, the present invention discloses carrier configurations to reduce or eliminate liquid droplet contamination, for example, occurring after a wet processing. The carrier configurations comprise drip edges leading away from the substrate area, preventing the liquid droplets from falling on the substrate surfaces.

In some embodiments, the present invention recognizes that downward tilted, such as vertical, surfaces or paths, especially within the area of the substrate surface, can accumulate droplets, which then can drop onto the substrate to contaminate the substrate. In addition, horizontal surfaces can accumulate droplets, thus can potentially dropping liquid on the substrate.

Figure 2A:
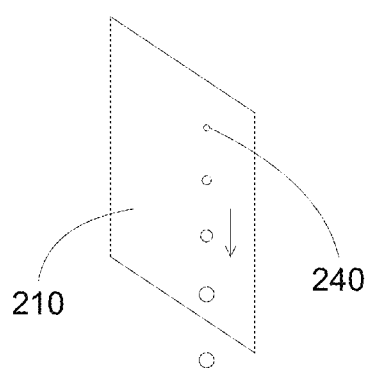
FIGS. 2A-2E illustrate exemplary surface configurations that can accumulate and drop liquid droplets according to some embodiments.

FIGS. 2A-2E illustrate exemplary surface configurations that can accumulate and drop liquid droplets according to some embodiments. In FIG. 2A, a vertical surface 210 is shown, where a droplet 240 can run down the vertical surface 210, for example, under gravitation force, to accumulate at the bottom of the surface 210. The droplet 240 can collect further liquid along the way, and can become large enough to drop from the vertical surface 210. If the droplet 240 is formed in a vicinity of the substrate surface, the droplet can fall on the substrate, generating contamination spots.

Figure 2B:
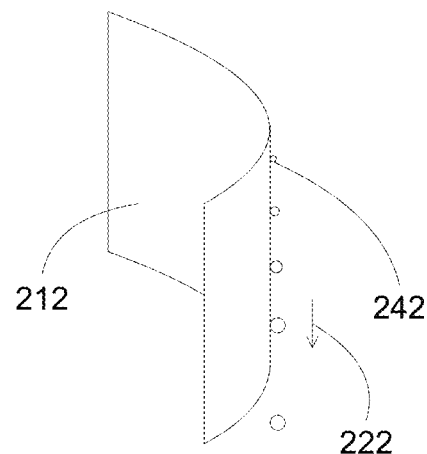

In FIG. 2B, a curve surface 212 is shown, comprising multiple vertical paths 222 for droplet traveling. A droplet 242 can run down the vertical path 222, for example, under gravitation force, to accumulate at the bottom of the surface 212. The droplet 242 can collect further liquid along the way, and can become large enough to drop from the vertical surface 212.

Figure 2C:
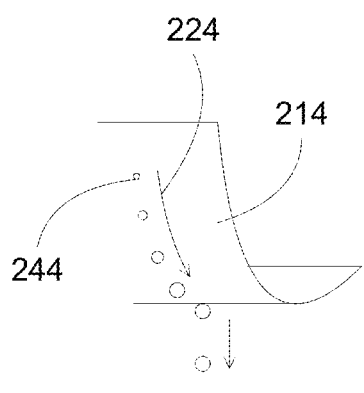

In FIG. 2C, a curve surface 214 is shown, comprising multiple paths 224 for droplet traveling. A droplet 244 can run down the vertical path 224, for example, under gravitation force, to accumulate at the bottom of the surface 214. The droplet 244 can collect further liquid along the way, and can become large enough to drop from the vertical surface 214.

Figure 2D:
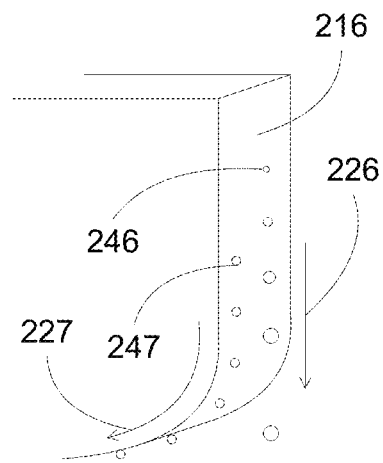

In FIG. 2D, a curve surface 216 is shown, comprising multiple paths 226 and 227 for droplet traveling. A droplet 247 can run down the vertical path 227, for example, under gravitation force, to accumulate at the bottom of the surface 216. The droplet 247 can follow the curvature path 227 away from the substrate, thus causing no potential damage to the substrate. Alternatively, another droplet 246 can run down the vertical path 226, collecting further liquid along the way, and can become large enough to drop from the vertical surface 216. Since the vertical surface 216 is likely to be in a vicinity of the substrate surface, the droplet can fall on the substrate, generating contamination spots. Thus the curve surface 216 can reduce potential contamination as compared to flat surface 210 and to curve surface 212 or 214. However, in certain cases, contamination droplets can occurs, e.g., along path 226 on curve surface 216. Thus substrate carriers without vertical surfaces or vertical paths are preferred. In some embodiments, the present invention discloses methods and apparatuses for substrate carriers without vertical surfaces or vertical paths, especially the surfaces or paths that are positioned within the substrate area.

Figure 2E:
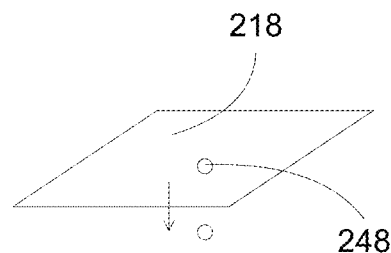

In FIG. 2E, a horizontal surface 218 is shown. A droplet 248 can randomly occur on the surface 218 and drop onto a substrate surface. Thus substrate carriers without horizontal surfaces are preferred. In some embodiments, the present invention discloses methods and apparatuses for substrate carriers without horizontal surfaces, especially the surfaces or paths that are positioned within the substrate area.

In some embodiments, carrier structures, and methods to use the carrier structures, are provided to avoid the potential contamination caused by liquid droplets falling on the substrates. The carrier structures can be configured to avoid the accumulation points, for example, caused by a downward tilted line or surface, which are positioned near or in a space defined by two adjacent substrates.

In some embodiments, the carrier structure can be configured so that liquid droplets are drained by gravitation force away from the substrates, or away from a space defined by two adjacent substrates. The carrier structure can be configured so that the falling of liquid droplets from the carrier structure would not land on the substrate surface. For example, the carrier structure can be configured so that any liquid accumulation point are positioned away from the substrates, or away from a volume defined by the multiple substrates. The carrier structure can be configured as not to have a point, a horizontal line or a horizontal surface within the substrates, or within a volume defined by the multiple substrates, which can trap the liquid droplets.

In some embodiments, the carrier structure can include paths so that the liquid droplets travel away from the substrates. For example, the carrier structure can have tilted lines or surfaces toward the bottom of the substrates and away from the substrates.

In some embodiments, the carrier structure can include paths so that the liquid droplets travel to the ground. The ground paths can avoid splattering of the liquid, which can further reduce substrate contamination. For example, the carrier structure can have tilted lines or surfaces toward one end of the carrier structure, and then channels at the end to the ground. A side structure of the carrier structure can have tilted lines or surface toward an end structure so that the droplets can travel to the end structure. The end structure can have channels or paths to guide the liquid to the floor, without any accumulation of the liquid on the carrier structure.

In some embodiments, the present invention discloses substrate carriers comprising multiple teeth which are configured to comprise drip edges leading away from the tips of the teeth. For example, the substrate carriers can include side structures such as rods or plates, with protruding teeth which can protrude to a space between two adjacent substrates for separating the two adjacent substrates.

In some embodiments, the substrate carriers comprise teeth configurations having slanted angles for teeth surfaces and teeth lines. In some embodiments, the teeth configurations do not comprise vertical surfaces or lines, at least in the teeth area that can contact the substrate. The slanted angles can be directed away from the substrate, or can be leading to another slanted angle which is directed away from the substrate.

Figure 3A:
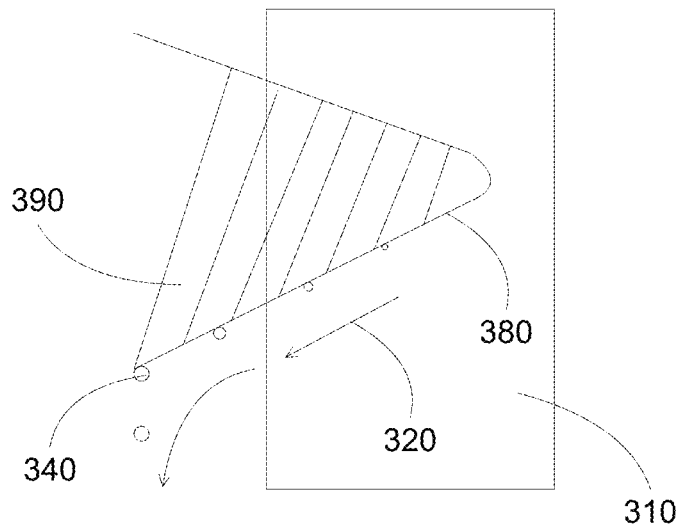
FIGS. 3A-3C illustrate exemplary slanted configurations for the teeth of a substrate carrier according to some embodiments.
Figure 3B:
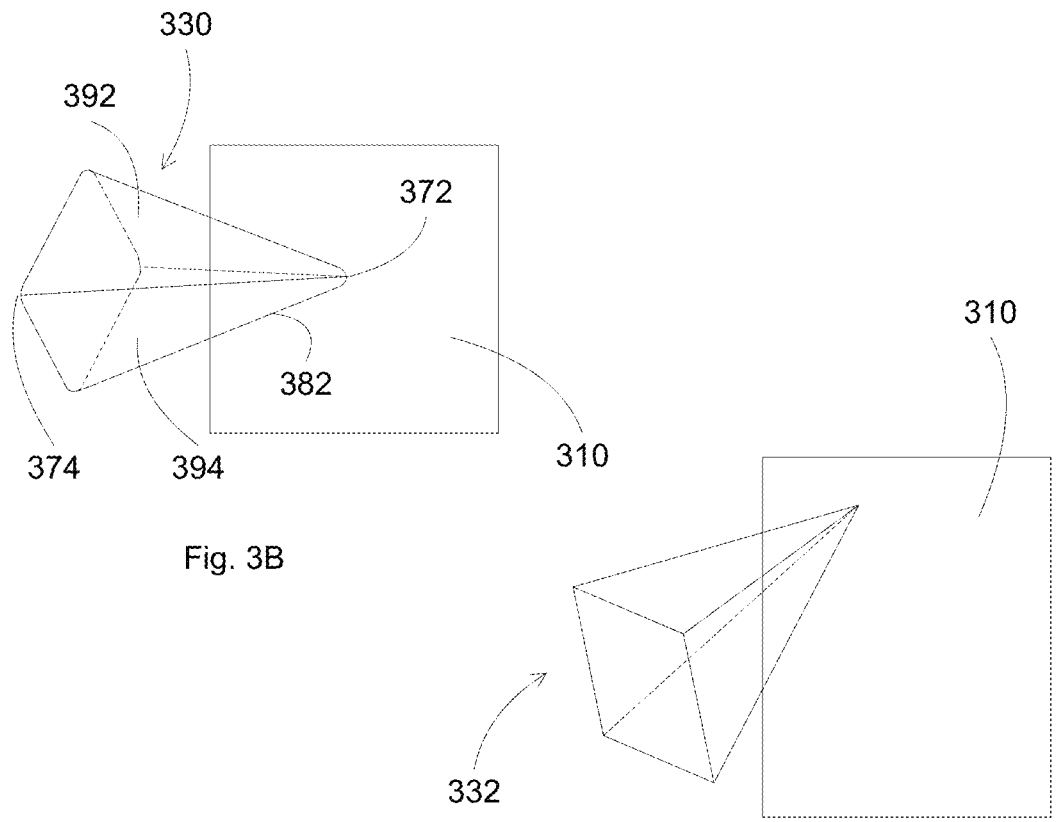
Figure 3C:
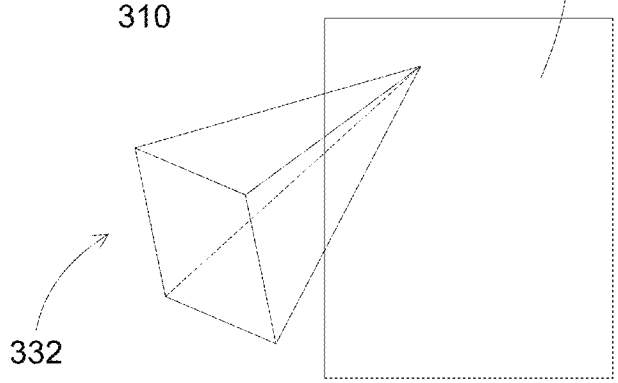

FIGS. 3A-3C illustrate exemplary slanted configurations for the teeth of a substrate carrier according to some embodiments. In FIG. 3A, a tooth 390 protrudes toward a substrate 310 so that a portion of the tooth 390 is positioned within the area of the substrate. The tooth 390 comprises slanted angles 380, so that droplets 340 travel along a slanted path 320 away from the substrate 310. The slanted angles extend outside the substrate area, so that the droplets do not fall on the substrate surface.

In FIG. 3B, a tooth 330 in the shape of a pyramid having a quadrilateral base (4 side polygon) is protruded toward the substrate 310. The tooth 330 comprises slanted surfaces 392 and 394, which can direct droplets toward a slanted line 382, where droplets can be drained outside the substrate area. Sharp corners or rounded corners, e.g., 372 and 374, can be used, to facilitate the running of droplets toward the outside of the substrate area.

In some embodiments, the present invention discloses teeth configurations comprising bottom slanted angles, e.g., slanted surface or lines, toward outside of the substrate area. The top angles can be slanted toward the inside of the substrate area, with drip edge leading back to the outside, for example, at the bottom slanted angles.

In FIG. 3C, tooth 332 is further pointing upward, forming all downward slanting surfaces and lines toward the outside area of the substrate 310. When connecting to a side structure, such as a rod or a plate, the tooth 332 can have the top edge shorter than the bottom edge. Other shapes can be used, such as a cone shape or pyramid shape with different polygon base.

In some embodiments, the present invention discloses carriers having teeth configurations comprising slanted angles, e.g., slanted surface or lines, toward outside of the substrate area. The teeth can be configured on side plates or on side rods, sandwiching the substrates. The slanted angle can be greater than about 10 degrees, or greater than about 30 or 45 degrees.

FIGS. 4A-4B illustrate an exemplary carrier having a slanted teeth configuration according to some embodiments. FIG. 4A shows a perspective view and FIG. 4B shows a side view of a side of a carrier 400, comprising a side plate 430 having a plurality of teeth 435. The teeth 435 are arranged in two rows for supporting substrates 410. The teeth in a row are configured to separate the substrates. For example, the teeth can comprise a pyramid shape, with the tips of two nearby pyramids are wider than the thickness of the substrate. The bottom portions of the nearby pyramids are narrower than the thickness of the substrate. Thus the substrate can be resting against the edges of the pyramid teeth. Alternatively, the bottom portions of two adjacent pyramids can be wider than the thickness of the substrate, and the substrate can be resting against the side plate 430.

Figure 5A:
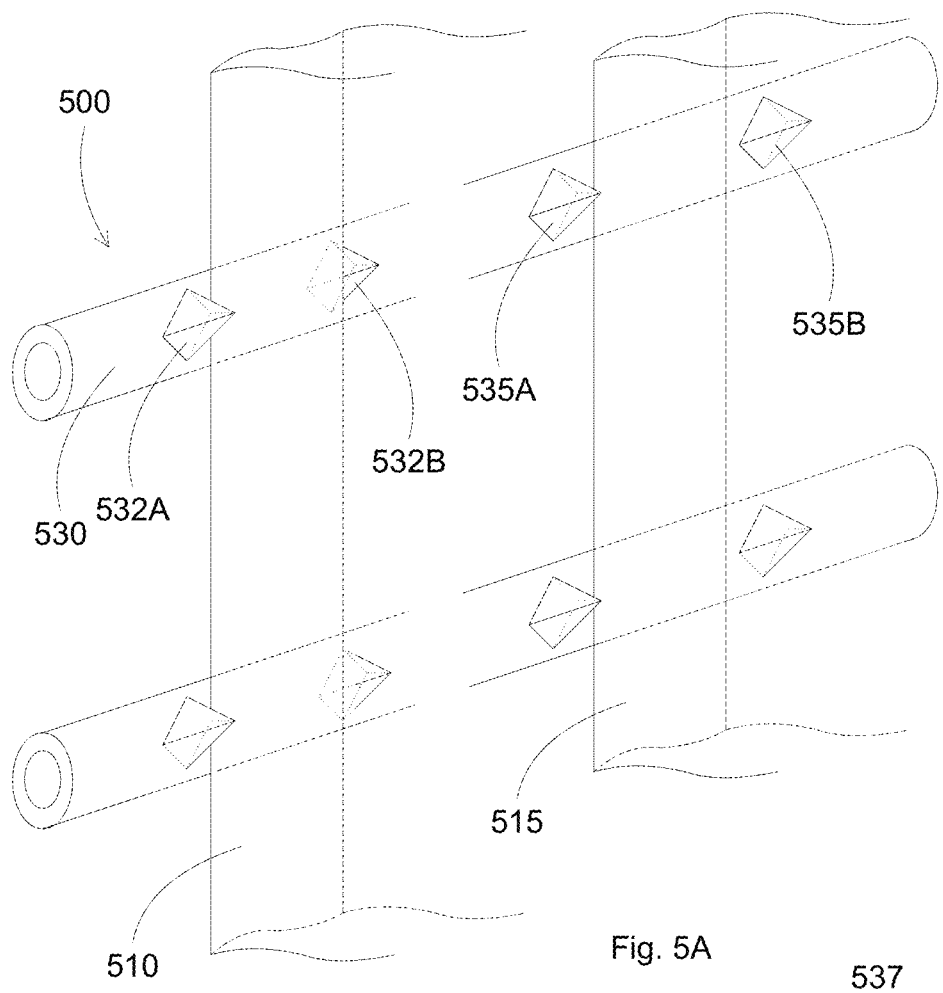
FIGS. 5A-5D illustrate another exemplary carrier having a slanted teeth configuration according to some embodiments.
Figures 5B, 5C, 5D:
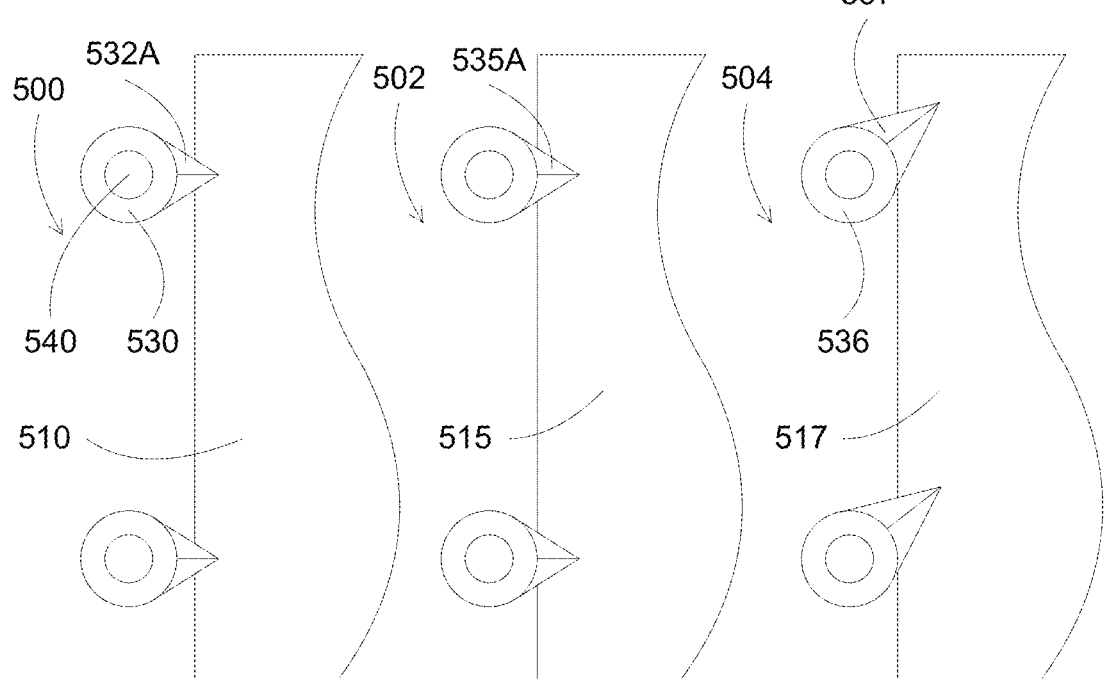

FIGS. 5A-5D illustrate another exemplary carrier having a slanted teeth configuration according to some embodiments. FIG. 5A shows a perspective view of a carrier 500 and FIGS. 5B-5C shows different side views of different carriers 500-504, comprising two rods having a plurality of teeth. FIGS. 5A and 5B show a same carrier 500, and FIGS. 5C and 5D show two different carriers 502 and 504, having some modifications from carrier 500. The rods 530 comprise teeth 532A, 532B, 535A and 535B are arranged periodically along the rods for supporting substrates 510, configured to separate the substrates. For example, the teeth 532A and 532B can comprise a pyramid shape, with the tips of two nearby pyramids are wider than the thickness of the substrate. The bottom portions of the nearby pyramids are narrower than the thickness of the substrate 510. Thus the substrate can be resting against the edges of the pyramid teeth (see FIGS. 5A and 5B). Alternatively, the teeth 535A and 535B can comprise a pyramid shape, with the bottom portions of two adjacent pyramids wider than the thickness of the substrate 515, and the substrate can be resting against the rods 530 (see FIGS. 5A and 5C). In some embodiments, the rods and teeth comprise polymeric materials, such as plastic or polymer. The rods can comprise a core 540, for example, a metal or a steel core to enforce the rigidity of the rods.

The teeth 532A, 532B, 535A and 535B are shown to be positioned in a substantially horizontal configuration, with the top portion slanted toward the substrate and the bottom portion slanted away from the substrate. Thus a liquid droplet can travel along the slanted portions and ultimately drain away from the substrate. For example, a droplet can travel form the top portion, connecting to the bottom portion, and then following the bottom portion away from the substrate.

FIG. 5D shows an exemplary configuration of a rod 536, comprising the teeth 537 pointing upward. The slanted portions of the teeth are then directed away from the substrate, thus droplets can all travel away from the substrate area. The rod 536 can be the same rod 530, with an additional rotation along the center of the rod, so that the pyramid teeth are positioned in an upward slanted configuration. The rod 536 can be different from the rod 530, for example, with longer pyramid (e.g., taller or higher pyramid) to accommodate the substrate separation purposes. Other configurations are also within the scope of the present invention, such as teeth configuration having polygon base, teeth configuration having rounded corners, etc.

In some embodiments, the rod can comprise different configurations, for example, to optimize the drip edge of droplets. In some embodiments, symmetrical rods and symmetrical teeth can be used, for example, for ease of fabrication and minimizing rod warpage.

Figure 6A:
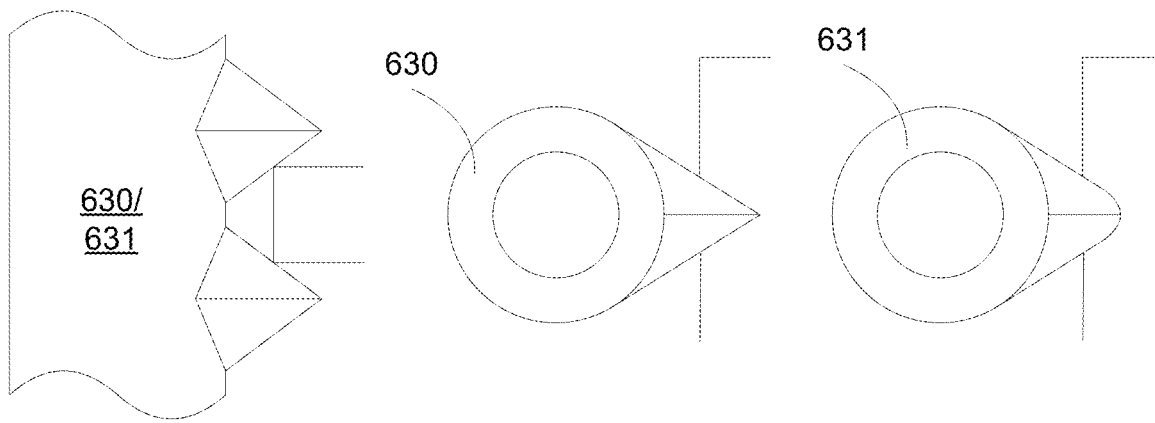
FIGS. 6A-6C illustrate exemplary rod configurations according to some embodiments.
Figure 6B:
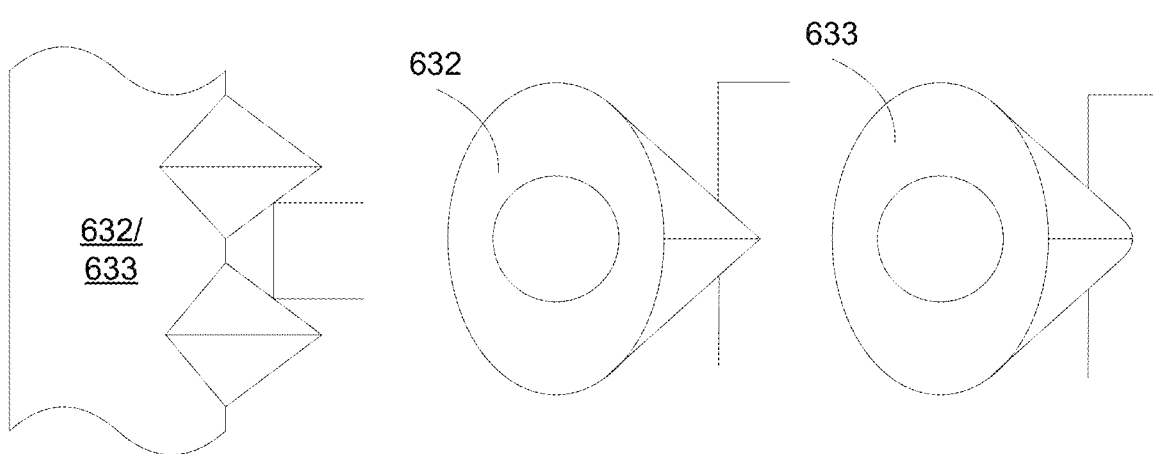
Figure 6C:
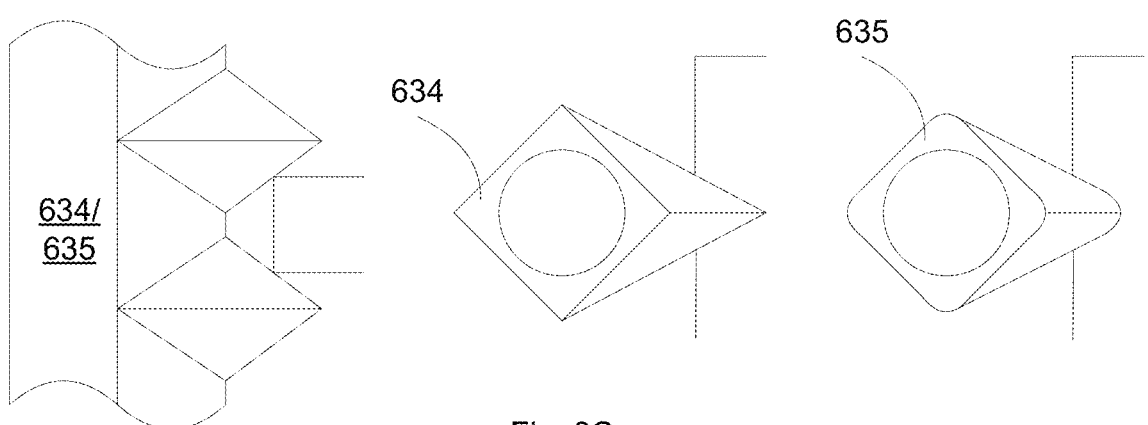

FIGS. 6A-6C illustrate exemplary rod configurations according to some embodiments. In FIG. 6A, a rod 630 or 631 comprises a circular cross section with enforcement core. The teeth can comprise a pyramid shape, with sharp corner (rod 630) or rounded corners (rod 631). In FIG. 6B, a rod 632 or 633 comprises an elliptical cross section with enforcement core. The teeth can comprise a pyramid shape, with sharp corner (rod 632) or rounded corners (rod 633). The elliptical shape can comprise a longer axis in a vertical direction, to generate a larger slanted angle for the teeth surface of lines. Alternatively, the elliptical shape can comprise a shorter axis in a vertical direction (not shown), to provide better stability and less deflected angle to the teeth. In FIG. 6C, a rod 634 or 635 comprises a square cross section or a quasi-square cross section (e.g., a diamond shape or a square with rounded corners) with enforcement core. The teeth can comprise a pyramid shape, with sharp corner (rod 634) or rounded corners (rod 635). The square shape can comprise a diagonal line aligned in a vertical direction, to generate a larger slanted angle for the teeth surface of lines. The rod profiles can have increased rigidity, for example, with respect to the bending in the two principal directions, e.g., vertical and horizontal.

Other configurations can be used. The rods are shown with the pyramid teeth disposed in a substantially horizontal direction, but any direction can be used, such as an upward pointing pyramid. In addition, other teeth configurations can be used, such as cone shape teeth or cylindrical shaper teeth with cone or pyramid tip. For cylindrical shape teeth, the teeth can be position upward to prevent horizontal line.

In some embodiments, non symmetrical cross section rods can be used, for example, to optimize the slanted angle of the drip edge for the droplets.

Figure 7A:
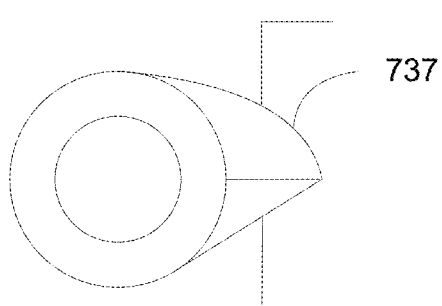
FIGS. 7A-7D illustrate exemplary cross sections of a rod according to some embodiments.
Figure 7B:
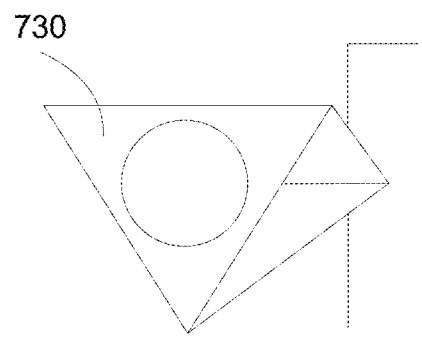
Figure 7C:
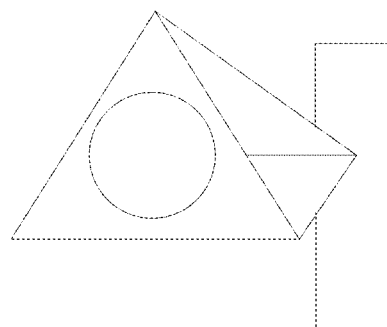
Figure 7D:
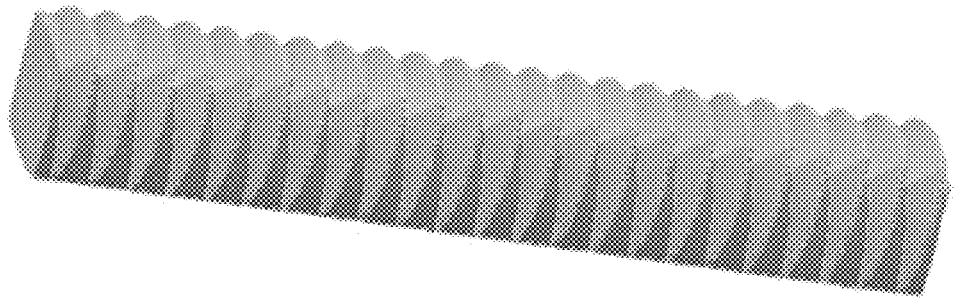

FIGS. 7A-7D illustrate exemplary cross sections of a rod according to some embodiments. In FIG. 7A, a circular rod can comprise teeth having a curve upper portion 737, such as an elliptical surface. The elliptical surface can minimize the possibility of the droplets to be falling from the top of the teeth to the substrate, offering better tendency for the droplets to follow the bottom portion toward the outside area. In FIGS. 7B and 7C, a triangular cross section rod can be used. Other configuration can be used, such as rounded corners, or upward pointing teeth. In FIG. 7D, a rod is shown, having a quasi square cross section, together with bow teeth.

Figure 8A:
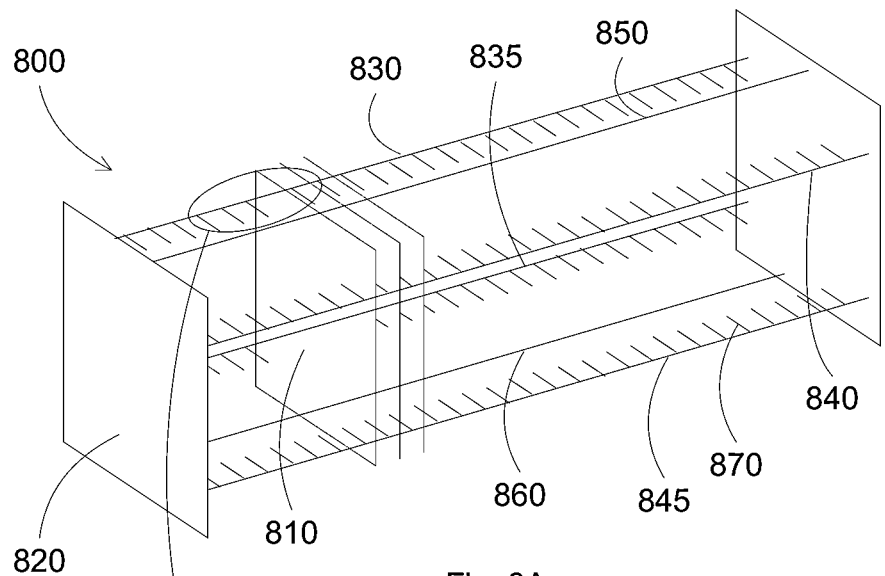
FIGS. 8A-8B illustrate an exemplary carrier according to some embodiments of the present invention.
Figure 8B:
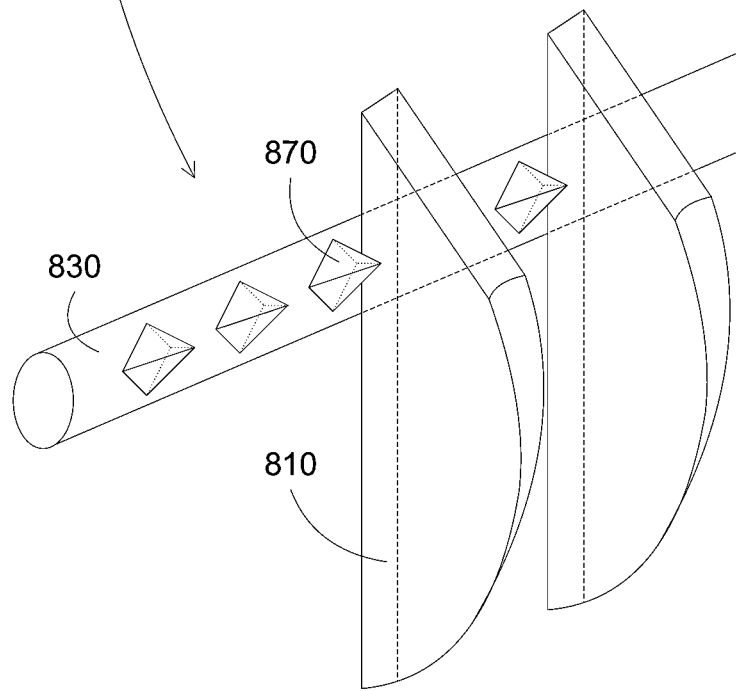

FIGS. 8A-8B illustrate an exemplary carrier according to some embodiments of the present invention. A carrier 800 comprises two end plates 820 coupled to a plurality of rods 830, 835, 840, 845, 850, and 860 for supporting the substrates 810. The rods 830 and 835 are disposed in one side, and rods 840 and 845 are disposed in an opposite side, sandwiching the substrates 810. Rod 860 is disposed under the substrates, for supporting the substrates. Rod 850 is optional, disposed on top of the substrates to prevent any movement of the substrates. Rod 850 can be removable, for removing the substrates. Rods 830, 835, 840 and 845 comprise pyramid teeth 870, for separating the substrates. Rods 850 and 860, as shown, do not comprise teeth. The configuration is exemplary, and any variations can be used, such as rods 850 and/or 860 can comprise teeth, or one or some of rods 830, 835, 840 and 845 do not comprise teeth. Further, additional rods can be added. The teeth can be configured to comprise slanted drip edge away from the substrates to prevent, eliminate or minimize contamination, for example, caused by droplets falling on the substrate from a carrier component, such as the teeth.

In some embodiments, the rods can be configured to further minimize contamination. The present drip edge configurations for the teeth can lead droplets to the rods, which is disposed outside the substrate area. In some embodiments, the present invention discloses a drip edge for the rods, further leading the droplets away from the substrates.

Figure 9A:
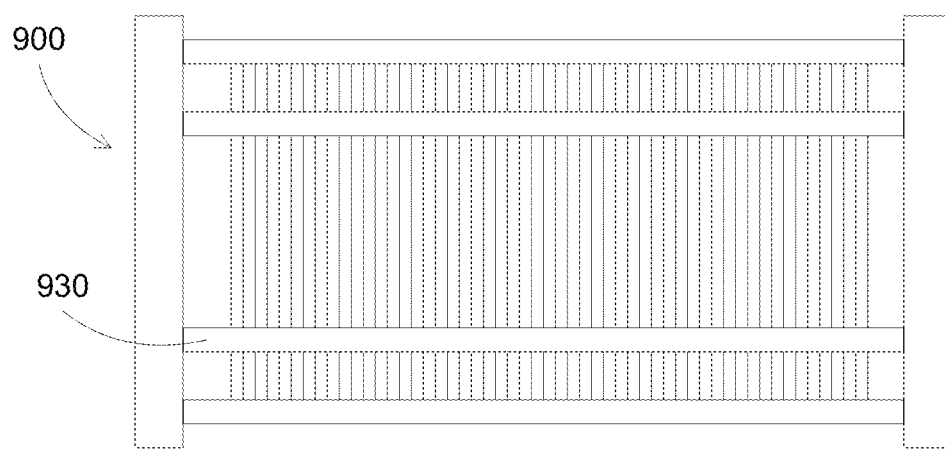
FIGS. 9A-9C illustrate exemplary carrier configurations according to some embodiments.
Figure 9B:
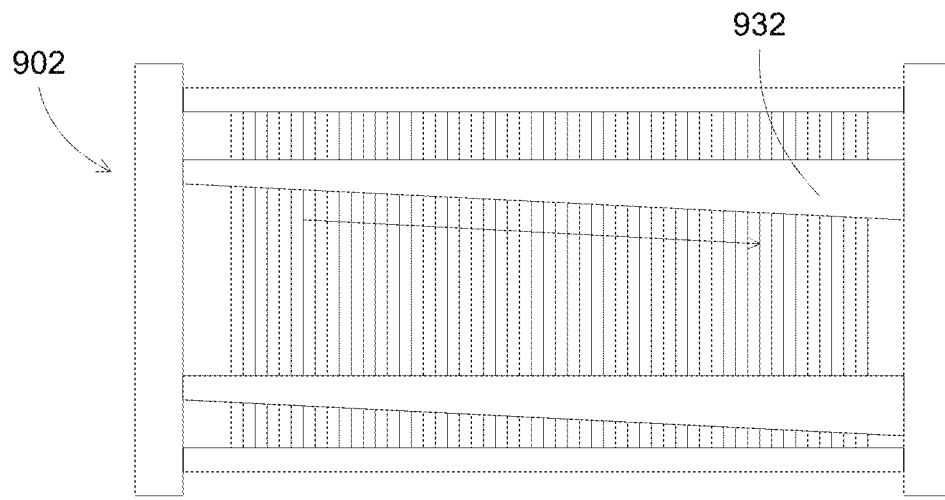
Figure 9C:
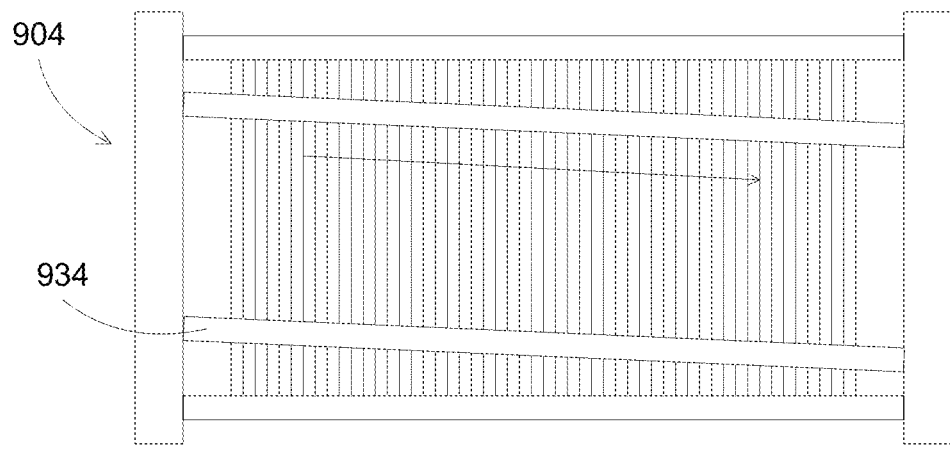

FIGS. 9A-9C illustrate exemplary carrier configurations according to some embodiments. In FIG. 9A, a carrier 900 comprises a plurality of rods 930, which can accumulate droplets accumulated from the teeth drip edges. In FIG. 9B, a carrier 902 comprises a plurality of rods that comprise a drip edge 932, disposed at a slanted angle. Thus the droplets accumulated at the rods will be further leading away from the substrate, and accumulated at the end plate of the carrier. The end carrier can also comprise drip edges to further leading the droplets to the bottom portion of the end plate. In FIG. 9C, a carrier 904 comprises a plurality of rods 934 that are disposed at a slanted angle. The teeth can be rotated with an appropriate angle, for example, to accommodate the substrates. Alternatively, the same rods can be used. Thus the droplets accumulated at the rods will be further leading away from the substrate, and accumulated at the end plate of the carrier. The slanted angle can be less than about 50 degrees, or less than about 40 or 30 degrees. The slanted angle can be greater than about 5 degrees, or greater than about 10 or 20 degrees.

In some embodiments, methods for using the substrate carriers are provided. One or more substrates can be placed in a carrier, with the substrates separated by a portion of the carrier that is protruded between every adjacent substrate. For example, the substrates can be separated by multiple teeth, which are secured to a side structure such as a rod or a plate. The carrier can include tilted surfaces or lines away from the substrate area to prevent liquid droplets dropping on the substrates.

The carrier and the substrates can be wet processed, for example, by submerged in a tank of liquid for cleaning or for wet etching. The carrier and the substrates can be sprayed with a liquid. After wet processing, the carrier and the substrates can be removed from the liquid environment to be dried, for example, by circulating hot gas. Before the substrate and the carrier are dried, any liquid droplet can be drained away from the substrates, preventing contamination to the substrates.

What is claimed is:

1. A semiconductor substrate carrier for supporting one or more semiconductor substrates, the semiconductor substrate carrier comprising:
   at least one first structure that defines a space, of the semiconductor substrate carrier, in which semiconductor substrates are held within the at least one first structure,
      wherein the at least one first structure comprises a rod,
      wherein the rod is re-enforced with a metal core; and
   at least one second structure,
      wherein the at least one second structure is secured to the at least one first structure, and
      wherein the at least one second structure is partially protruded into the space so as to separate two adjacent semiconductor substrates disposed within the at least one first structure, wherein each surface of the at least one second structure partially protruded into the space is configured so as to direct liquid droplets away from the space in which semiconductor substrates are held.

2. A semiconductor substrate carrier as in claim 1, further comprising:
   wherein the at least one second structure comprises a plurality of teeth, and
   wherein the plurality of teeth are positioned at a slanted angle, leading a droplet along a slanted path away from a respective semiconductor substrate.

3. A semiconductor substrate carrier as in claim 2, further comprising:
   wherein the plurality of teeth comprises at least one of a sharp corner and a rounded corner.

4. A semiconductor substrate carrier as in claim 2, further comprising:
   wherein the plurality of teeth are configured to comprise at least one drip edge leading away from the tips of the teeth.

5. A semiconductor substrate carrier as in claim 2, further comprising:
   wherein the plurality of teeth comprises at least one of a pyramid shape comprising at least one of an elliptical base and a polygon base, and, a cone shape comprising at least one of an elliptical base and a polygon base.

6. A semiconductor substrate carrier as in claim 1, further comprising:
   wherein the at least one second structure does not have a point, a horizontal line or a horizontal surface within the space, which can trap the liquid droplets.

7. A semiconductor substrate carrier as in claim 1, further comprising:
   wherein the at least one first structure is configured so that liquid droplets are drained by gravitation force toward one end of the at least one first structure.

8. A carrier for supporting one or more substrates, the carrier comprising:
   at least one first structure,
      wherein the first structure comprises an L shape having one side partially covering a side of the carrier and one side partially covering the bottom of the carrier,
      wherein the first structure comprises a plastic rod re-enforced with a metal core;
   at least one second structure,
      wherein the second structure is secured to the first structure, and
      wherein the second structure is partially protruded to a space for separating two adjacent substrates.

9. A carrier as in claim 8, further comprising:
   wherein the protruded portion of the second structure comprises a pyramid or a cone shape.

10. A carrier as in claim 9, further comprising:
    wherein the pyramid comprises an edge at the bottommost section.

11. A carrier as in claim 9, further comprising:
    wherein the pyramid or the cone shape comprise an apex pointing upward from the first structure.

12. A carrier as in claim 8, further comprising:
    wherein the cross-section of the rod comprises an elliptical shape,
    wherein the cross-section of the rod comprises a quasi-square shape, or
    wherein the cross-section of the rod comprises a triangular shape.

13. A carrier as in claim 8, further comprising:
    wherein a plurality of rods are configured to be slanted at an angle and parallel.

14. A carrier as in claim 8, further comprising:
    wherein the first structure comprises a slanted angle.

15. A carrier as in claim 8, further comprising:
    wherein the second structure comprises surfaces tilting away from the substrates so that liquid droplets are drained by gravitation force away from the space.

16. A carrier as in claim 8, further comprising:
    wherein the first structure is disposed at a side of the carrier, and the carrier further comprises a bottom structure for supporting the substrates at the bottom of the carrier.

17. A carrier as in claim 8, further comprising:
    wherein the rod is circular, and wherein the second structure comprises a curve upper portion.

\* \* \* \* \*